United States Patent
Cote et al.

(10) Patent No.: US 8,636,223 B2
(45) Date of Patent: Jan. 28, 2014

(54) ONE AND TWO-PART PRINTABLE EM TAGS

(75) Inventors: Andre Cote, Williamstown, NJ (US);
Paul Richard Clarke, Surrey (GB);
Anthony Kington, Surrey (GB)

(73) Assignee: Omni-ID Cayman Limited, Grand Cayman (KY)

( * ) Notice: Subject to any disclaimer, the term of this patent is extended or adjusted under 35 U.S.C. 154(b) by 0 days.

(21) Appl. No.: 13/432,291

(22) Filed: Mar. 28, 2012

(65) Prior Publication Data

US 2012/0181341 A1 Jul. 19, 2012

Related U.S. Application Data

(62) Division of application No. 12/544,766, filed on Aug. 20, 2009.

(60) Provisional application No. 61/090,564, filed on Aug. 20, 2008.

(51) Int. Cl.
*G06K 7/08* (2006.01)
*G06K 19/06* (2006.01)

(52) U.S. Cl.
USPC .......................................... 235/492; 235/451

(58) Field of Classification Search
USPC ................................ 235/375, 383, 451, 492
See application file for complete search history.

(56) References Cited

U.S. PATENT DOCUMENTS

| | | |
|---|---|---|
| 2,990,547 A | 6/1961 | McDougal |
| 3,065,752 A | 11/1962 | Potzl |
| 4,242,685 A | 12/1980 | Sanford |
| 4,498,076 A | 2/1985 | Lichblan |
| 4,714,906 A | 12/1987 | D'Albert et al. |
| 4,728,938 A | 3/1988 | Kaltner |
| 4,835,524 A | 5/1989 | Lamond et al. |
| 4,890,111 A | 12/1989 | Nicolet et al. |
| 5,276,431 A | 1/1994 | Piccolli et al. |
| 5,285,176 A | 2/1994 | Wong et al. |
| 5,557,279 A | 9/1996 | D'Hont |
| 5,565,875 A | 10/1996 | Buralli et al. |
| 5,677,698 A | 10/1997 | Snowdon |
| 5,682,143 A | 10/1997 | Brady et al. |
| 5,949,387 A | 9/1999 | Wu et al. |
| 5,973,600 A | 10/1999 | Mosher, Jr. |
| 5,995,048 A | 11/1999 | Smithgall et al. |

(Continued)

FOREIGN PATENT DOCUMENTS

| | | |
|---|---|---|
| EP | 0512491 | 11/1992 |
| EP | 0548851 | 12/1992 |

(Continued)

OTHER PUBLICATIONS

Hibbins, et al., "Squeezing Millimeter Waves into Microns", Physical Review Letters, vol. 92, No. 14, 2004.

(Continued)

*Primary Examiner* — Tuyen K Vo
(74) *Attorney, Agent, or Firm* — McDonnell Boehnen Hulbert & Berghoff LLP

(57) ABSTRACT

The present invention relates to methods of assembly, labeling and programming decoupled EM tags used in the tagging and tracking of items wherein the tags including a printable label portion and a decoupler portion which are combined after printing on the surface of and programming a programmable device associated with the label portion.

10 Claims, 6 Drawing Sheets

(56) References Cited

U.S. PATENT DOCUMENTS

| | | | |
|---|---|---|---|
| 6,049,278 | A | 4/2000 | Guthrie et al. |
| 6,072,383 | A | 6/2000 | Gallagher, III et al. |
| 6,118,379 | A | 9/2000 | Kodukula et al. |
| 6,121,880 | A | 9/2000 | Scott et al. |
| 6,130,612 | A | 10/2000 | Castellano et al. |
| 6,147,605 | A | 11/2000 | Vega et al. |
| 6,172,608 | B1 | 1/2001 | Cole |
| 6,208,235 | B1 | 3/2001 | Trontelj |
| 6,229,444 | B1 | 5/2001 | Endo et al. |
| 6,239,762 | B1 | 5/2001 | Lier |
| 6,265,977 | B1 | 7/2001 | Vega et al. |
| 6,271,793 | B1 | 8/2001 | Brady et al. |
| 6,285,342 | B1 | 9/2001 | Brady et al. |
| 6,307,520 | B1 | 10/2001 | Liu |
| 6,339,406 | B1 | 1/2002 | Nesic et al. |
| 6,366,260 | B1 | 4/2002 | Carrender |
| 6,456,228 | B1 | 9/2002 | Granhed et al. |
| 6,483,481 | B1 | 11/2002 | Sievenpiper et al. |
| 6,507,320 | B2 | 1/2003 | Von Stein et al. |
| 6,509,880 | B2 | 1/2003 | Sabet et al. |
| 6,516,182 | B1 | 2/2003 | Smith et al. |
| 6,552,696 | B1 | 4/2003 | Sievenpiper et al. |
| 6,642,898 | B2 | 11/2003 | Eason |
| 6,646,618 | B2 | 11/2003 | Sievenpiper |
| 6,812,893 | B2 | 11/2004 | Waterman |
| 6,816,380 | B2 | 11/2004 | Credelle et al. |
| 6,825,754 | B1 | 11/2004 | Rolin |
| 6,911,952 | B2 | 6/2005 | Sievenpiper et al. |
| 6,914,562 | B2 | 7/2005 | Forster |
| 6,944,424 | B2 | 9/2005 | Heinrich et al. |
| 6,946,995 | B2 | 9/2005 | Choi et al. |
| 7,075,437 | B2 | 7/2006 | Bridgelall et al. |
| 7,212,127 | B2 | 5/2007 | Jacober et al. |
| 7,225,992 | B2 | 6/2007 | Forster |
| 7,298,343 | B2 | 11/2007 | Forster et al. |
| 7,315,248 | B2 | 1/2008 | Egbert |
| 7,768,400 | B2 | 8/2010 | Lawrence et al. |
| 7,880,619 | B2 | 2/2011 | Brown et al. |
| 2001/0036217 | A1 | 11/2001 | Kopf et al. |
| 2002/0130817 | A1 | 9/2002 | Forster et al. |
| 2002/0167500 | A1 | 11/2002 | Gelbman |
| 2002/0170969 | A1 | 11/2002 | Bridgelall |
| 2002/0175873 | A1 | 11/2002 | King et al. |
| 2002/0177408 | A1 | 11/2002 | Forster et al. |
| 2003/0112192 | A1 | 6/2003 | King et al. |
| 2003/0169204 | A1 | 9/2003 | Saito |
| 2003/0197613 | A1 | 10/2003 | Hernandez et al. |
| 2004/0020036 | A1 | 2/2004 | Arneson et al. |
| 2004/0111338 | A1 | 6/2004 | Bandy et al. |
| 2004/0201522 | A1 | 10/2004 | Forster |
| 2005/0012616 | A1 | 1/2005 | Forster |
| 2005/0030201 | A1 | 2/2005 | Bridgelall |
| 2005/0092845 | A1 | 5/2005 | Forster et al. |
| 2005/0107092 | A1 | 5/2005 | Charych |
| 2005/0151699 | A1 | 7/2005 | Eastin |
| 2005/0200539 | A1 | 9/2005 | Forster et al. |
| 2006/0028344 | A1 | 2/2006 | Forster |
| 2006/0033609 | A1 | 2/2006 | Bridgelall |
| 2006/0043198 | A1 | 3/2006 | Forster |
| 2006/0049947 | A1 | 3/2006 | Forster |
| 2006/0055542 | A1 | 3/2006 | Forster et al. |
| 2006/0086808 | A1 | 4/2006 | Appalucci et al. |
| 2006/0145927 | A1 | 7/2006 | Choi et al. |
| 2006/0220866 | A1 | 10/2006 | Dixon et al. |
| 2006/0220869 | A1 | 10/2006 | Kodukula et al. |
| 2006/0261950 | A1 | 11/2006 | Arneson et al. |
| 2007/0007342 | A1 | 1/2007 | Cleeves et al. |
| 2007/0096852 | A1* | 5/2007 | Lawrence et al. ............. 333/195 |
| 2007/0285907 | A1 | 12/2007 | Nishikawa et al. |
| 2007/0290941 | A1* | 12/2007 | Brown et al. ................. 343/842 |
| 2008/0055045 | A1* | 3/2008 | Swan et al. ................... 340/10.1 |
| 2008/0129625 | A1 | 6/2008 | Svensson et al. |
| 2008/0186245 | A1* | 8/2008 | Hilgers ......................... 343/803 |
| 2010/0045025 | A1 | 2/2010 | Cote et al. |
| 2010/0230497 | A1 | 9/2010 | Brown et al. |
| 2011/0037541 | A1 | 2/2011 | Brown et al. |
| 2011/0121079 | A1 | 5/2011 | Lawrence et al. |

FOREIGN PATENT DOCUMENTS

| | | |
|---|---|---|
| EP | 1018703 | 7/2000 |
| EP | 1055943 | 11/2000 |
| EP | 1280231 | 1/2003 |
| EP | 1533867 | 5/2005 |
| EP | 1538546 | 6/2005 |
| EP | 1548629 | 6/2005 |
| EP | 1548639 | 6/2005 |
| GB | 2428939 | 2/2007 |
| JP | 63 151101 | 6/1988 |
| JP | 08-084013 | 3/1996 |
| JP | 2004054337 | 2/2004 |
| JP | 2004164055 | 6/2004 |
| JP | 2005-094360 | 4/2005 |
| JP | 2005191705 | 7/2005 |
| JP | 2005-271090 | 10/2005 |
| JP | 2005-303528 | 10/2005 |
| JP | 2006157905 | 6/2006 |
| JP | 2006-311239 | 11/2006 |
| WO | WO 98/43217 | 10/1998 |
| WO | WO 99/49337 | 9/1999 |
| WO | WO 00/05674 | 2/2000 |
| WO | WO 00/21031 | 4/2000 |
| WO | WO 00/23994 | 4/2000 |
| WO | WO 00/43952 | 7/2000 |
| WO | WO 02/07084 | 1/2002 |
| WO | WO 02/07496 | 1/2002 |
| WO | WO 02/099764 | 12/2002 |
| WO | WO 03/038747 | 5/2003 |
| WO | WO 03/090314 | 10/2003 |
| WO | WO 03/092119 | 11/2003 |
| WO | WO 03/096478 | 11/2003 |
| WO | WO 2004/025554 | 3/2004 |
| WO | WO 2004/093242 | 10/2004 |
| WO | WO 2004/093246 | 10/2004 |
| WO | WO 2004/093249 | 10/2004 |
| WO | WO 2004/097731 | 11/2004 |
| WO | WO 2004/102735 | 11/2004 |
| WO | WO 2005/045755 | 5/2005 |
| WO | WO 2005/048181 | 5/2005 |
| WO | WO 2006/006898 | 1/2006 |
| WO | WO 2006/009934 | 1/2006 |
| WO | WO 2006/044168 | 4/2006 |
| WO | WO 2006/060324 | 6/2006 |
| WO | WO 2006/105162 | 10/2006 |
| WO | WO 2007/000578 | 1/2007 |
| WO | WO 2007/144574 | 12/2007 |
| WO | WO 2008/071971 | 6/2008 |
| WO | WO 2008/075039 | 6/2008 |
| WO | WO 2008/078089 | 7/2008 |

OTHER PUBLICATIONS

Otomi et al., "Expansion of RFID-tag Reading Distance with Polarized Wave Conversion Adaptor", The 2004 Kansai-Chapter Joint Convention of Institute of Electrical Engineering, Japan, Collection of Lecture Articles, Nov. 2004.

* cited by examiner

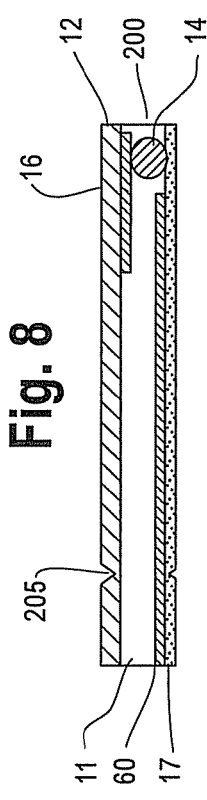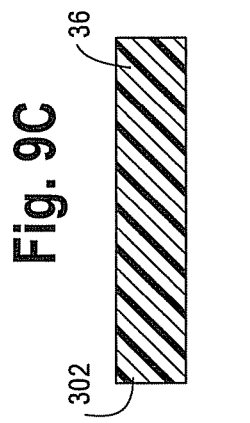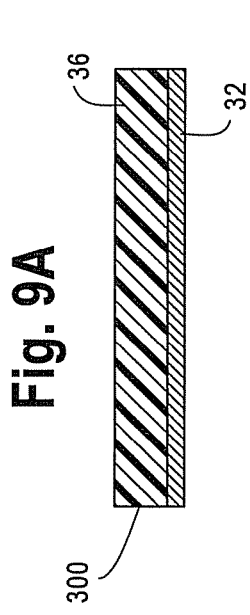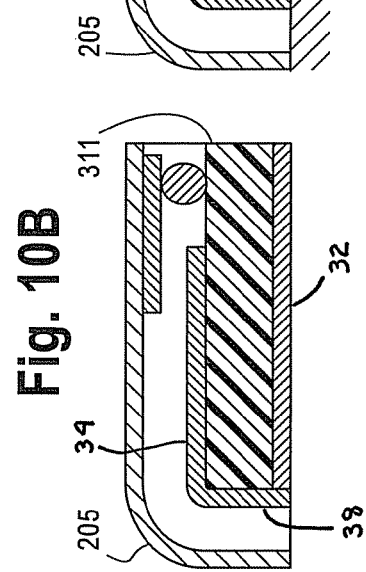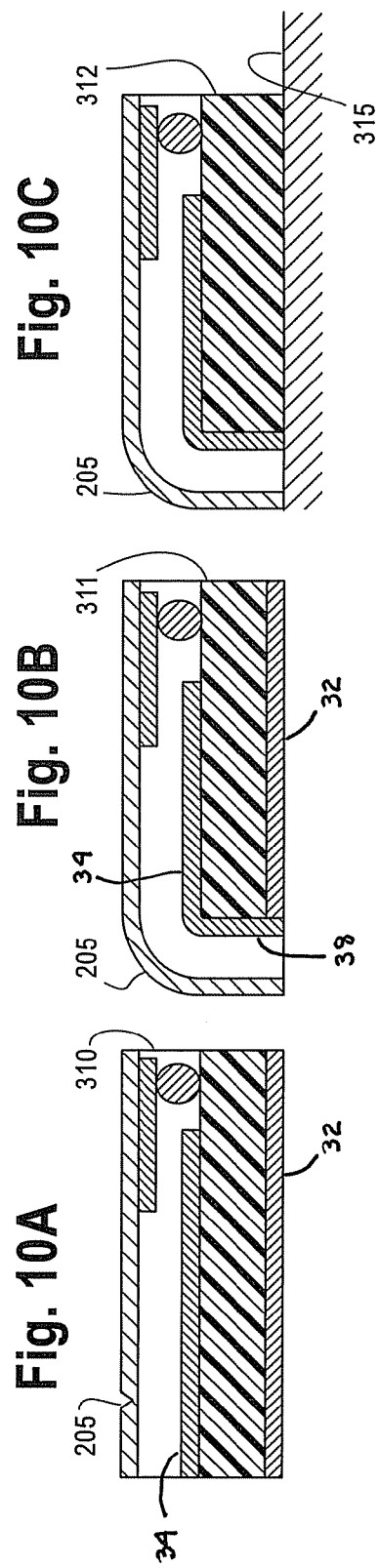

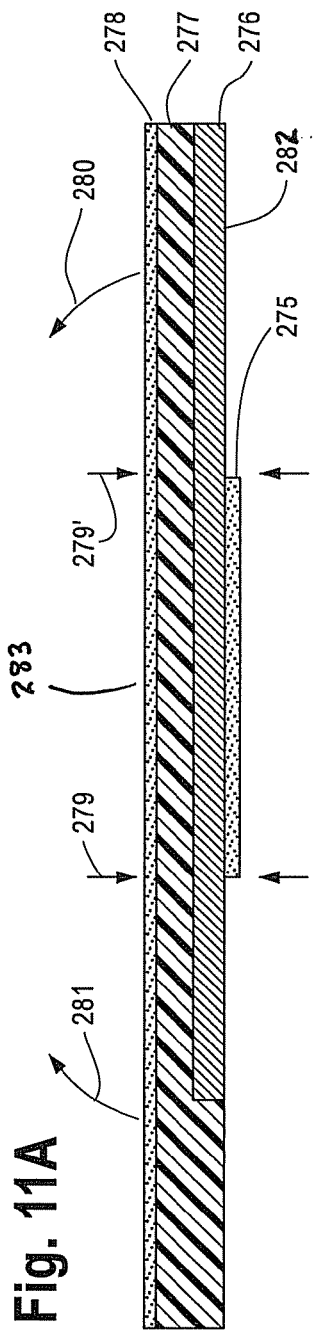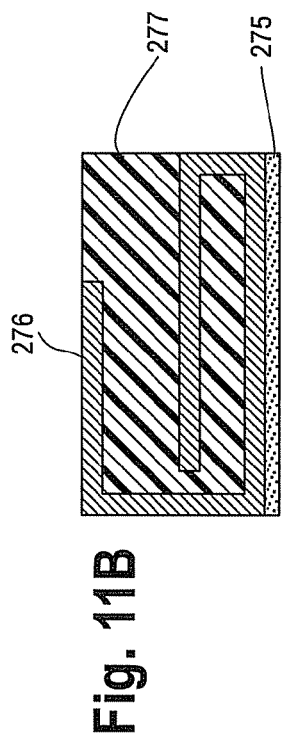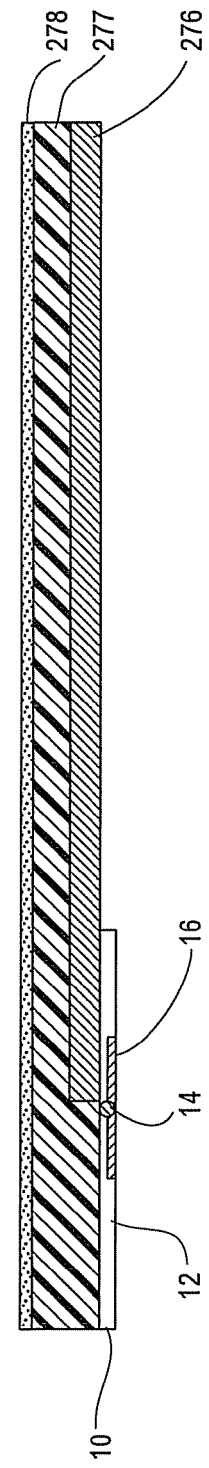

ONE AND TWO-PART PRINTABLE EM TAGS

This application is a divisional of co-pending U.S. patent application Ser. No. 12/544,766 filed on Aug. 20, 2009, which claims priority to provisional application Ser. No. 61/090,564, filed on Aug. 20, 2008, the specification of which is incorporated herein by reference.

BACKGROUND OF THE INVENTION (1) Field of the Invention

This invention concerns sub-assemblies, kits including sub-assemblies, and on-site on demand methods for assembling, labeling and programming the sub-assemblies to form electromagnetic devices used in the tagging and tracking of items such as assets, manufactured goods and so forth.

(2) Description of the Art

Most industries today rely on RFID technology to identify, track and authenticate items. Experience has shown that RFID can achieve substantial cost-savings and other operational improvements relative to alternative means of tracking, such as human-readable labels or machine-read barcodes.

In one approach to RFID tag deployment, commonly used when a decoupled RFID tag is not required, the end user creates a tag by printing and simultaneously encoding a label with an embedded RFID label tag and UHF dipole antenna. This approach has the advantage of using standard barcode printers with RFID encoding capabilities and it allows users to easily combine a human-readable label, barcode and an RFID tag on a single label. Such printers have been in use for many years, they are familiar to their users, they are easy to operate at high speeds, and they yield accurate results.

Unfortunately, because of their thickness (generally greater than 5 mm and often greater than 10 mm) decoupled RFID tags cannot be printed on-site because they cannot be fed through and printed on by standard printers. Therefore, the decoupled RFID tag commissioning process requires that each tag be placed upon an RFID reader/programming device, and its chip encoded with required data. A barcode or human-readable label must be separately printed and affixed to the tag. This is time consuming, and requires additional steps and equipment. As a result, the RFID community has substantial interest in improved methods for creating printed-on decoupled RFID tags on an on-demand basis at the point of deployment.

SUMMARY OF THE INVENTION

The present invention addresses one or more problems discussed above by providing a one or a two-part system where the parts can be used in all standard EM tag printing and programming equipment to allow for on-demand printing and encoding of the EM tag. The present invention includes at least one part that is or can be formed into a decoupler designed so that when the single part is constructed or when the two parts of the two part system are affixed to one another, the result is a complete RFID tag solution.

Specifically, the two-part embodiment is comprised of a substantially surface-independent EM tag comprising an EM tag (Piece I), and a physical decoupler (Piece 2) that is used to isolate the tag from surfaces that degrade tag performance. Piece 1 comprises all of the components necessary for the tag to manipulate electromagnetic radiation. At minimum, these include a programmable device such as a silicon chip and either a near field or far field antenna suitable for receiving encoding information from is a transponder or write enabled reader.

The components in Piece 1 are assembled onto a standard release liner for later association with Piece 2—the decoupler. The release liner may be arranged as a single sheet, a continuous feed roll, a continuous fan feed, as one of more peel off labels on a single sheet, or placed on any continuous carrier. The resulting sheets, rolls, labels etc. . . . including Piece 1 are suitable for feeding into standard RFID printer/encoders to print and/or encode non-decoupled RFID tags, such as dipole labels. Piece 1 may also be fashioned with a printable surface so that it may be used in devices that will both print and encode the chip in one or multiple passes. This surface can then be printed on or adhered to display logos, labels, human readable text, machine readable text or graphics, one or multi-dimensional bar codes, or holographic images.

Piece 2 is comprised of some subset of the actual components used to decouple Piece 1 from surfaces that degrade tag performance, such as metallic surfaces or surfaces of containers holding liquids, regardless or encasement or packaging. While Piece 2 may involve all of the pieces necessary to create the decoupling device, it may be possible, or even desirable to include subassemblies of the decoupling device as components included in Piece 1 of the process in so far as their inclusion does not prevent them from being utilized with the encoding printer.

One aspect of this invention are methods for manufacturing a decoupled EM tag comprising the steps of: preparing a printable label including a printable layer having a first surface and a second surface, an adhesive material layer adjacent to the printable layer second surface and an antenna electrically connected to a programmable device both located between the printable layer and the adhesive layer; preparing a decoupler having a bottom surface and a top surface, the bottom surface defining a first conductive side wall; and attaching the printable label to the decoupler to surface by placing the printable label adhesive layer into contact with the decoupler top surface.

Another aspect of this invention is a printable label comprising: a printable layer; an adhesive layer; and a programmable device electrically united to an antenna, the is combination being located between the printable layer and the adhesive layer.

Still another aspect of this invention is a kit for manufacturing decoupled EM tags on demand comprising a plurality of printable labels wherein the printable labels are identical; and a plurality of decouplers wherein the plurality of decouplers include decouplers selected from at least two of the following different decouplers:
  a. a first decoupler consisting essentially of a dielectric material
  b. a second decoupler consisting essentially of a first conductive side wall attached to a dielectric material layer; and
  c. a third decoupler consisting essentially of a first conductive side wall attached to a dielectric material layer and a conducting end wall.

Yet another embodiment of this invention is a deconstructed decoupler comprising a sheet including a conductive material layer having a first surface and a second surface, a dielectric layer associated with the conductive material layer second surface and at least one folding point wherein the folding point allows the sheet to be folded over upon itself at least one time such that the conduct material layer is prevented from creating a short circuit.

Still another embodiment of this invention is a method for forming a decoupled EM tag from a deconstructed decoupler that includes a programmable device and at least one foldable portion and at least one stationary portion by: programming the programmable device; and folding the at least one foldable portion until a top surface of the foldable portion abuts a top surface of the stationary portion to form a once folded decoupled EM tag.

DESCRIPTION OF THE FIGURES

FIG. 8 is an embodiment of a printable label of this invention that can be associated with different decoupler configurations to form different decoupled EM tag configurations;

FIGS. 9A, 9B and 9C are decoupler configurations that can be combined with the printable label of FIG. 8 to form decoupled EM tag configurations;

FIGS. 10A, 10B and 10C are decoupled EM tag configurations made by combining the decouplers of FIG. 9A, 9B or 9C with the printable label embodiment shown in FIG. 8; and FIGS. 11A and 11C are deconstructed decoupler and decoupler/label embodiments of the present invention while FIG. 11B is a decoupler made from the deconstructed decoupler shown in FIG. 11A.

DESCRIPTION OF CURRENT EMBODIMENTS

The present invention relates to methods of assembly, labeling and programming decoupled EM tags used in the tagging and tracking of items such as assets, manufactured goods, work in progress, documents or any objects where a unique item identification scheme is required. The present invention also concerns unique parts that are used in the decoupled EM tag assembly methods as well as kits including mixtures of parts that allow for the assembly of a variety of decoupled EM tag configurations. The invention is specific to tags or EM tags, which manipulate electromagnetic radiation (EM) into identification devices such as RF (radio frequency) tags, also known as RFID tags, that use a structure to decouple (i.e. isolate) the tag from surfaces that degrade its read performance, such as metallic surfaces and surfaces of liquid containers.

Specifically, the invention is a decoupled RFID tag that is deployed to the user as two discreet components (1) a decoupler; and (2) a printable label including an EM device. Alternatively, the components can be supplied as a single deconstructed sheet of material. Deploying the components as two parts or as a single deconstructed sheet allows the end user to apply a unique identifier to the printable label by printing, then encoding the portion of the tag that includes the EM device to be encoded and the tag labeled using standard printing and encoding technology in no particular order. The printable label and decoupler are then assembled to form a fully functional decoupled EM tag.

Figure 1A:
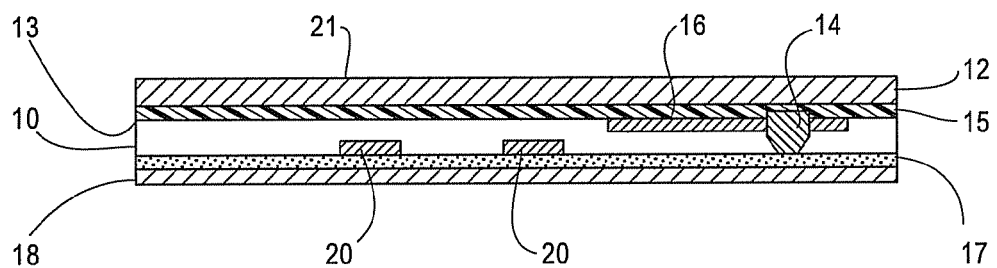
FIG. 1A is a side view of a printable label embodiment of this invention.
Figure 1B:
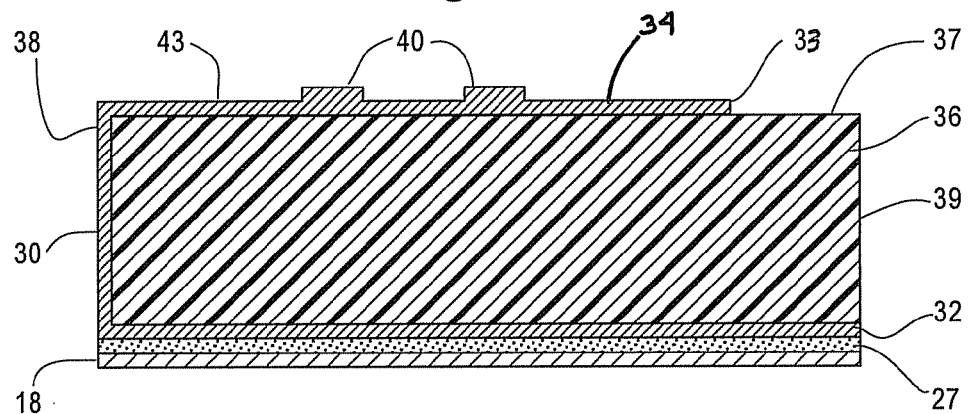
FIG. 1B is a side view of a decoupler embodiment of this invention.

FIGS. 1A and 1B are embodiments of two possible parts of this invention that can be used—on site—to construct decoupled EM tags in accordance with this invention. In FIG. 1A, the device first part is a printable label 10 having a printable layer 12, a programmable device 14, an antenna 16 associated with the programmable device 14, an adhesive layer 17 and an optional backing layer 18. The printable label may optionally include one or more alignment features 20.

FIG. 1B is an embodiment of the second part—a decoupler 30. Decoupler 30 shown in FIG. 1B includes a layer of metal forming a first conducting side wall 32 spaced apart from and parallel to a second layer of metal forming a second conducting side wall 34. Conducting side walls 32 and 34 define a sub-wavelength cavity, one end of which is closed by a conducting end wall or base portion 38. The combination of side walls 32 and 34 and end wall 38 forms a cavity that encloses a dielectric material 36 which may be air or may be one or more layers of dielectric material such as PET. One or both of the first and second conducting side walls 32 and 34 may be continuous with the conducting base portion 38. The end of the cavity opposite the conducting base portion 38 is an open end, i.e. it has no conducting wall. In addition, it is preferred that the second conducting side wall 34 is shorter in length than the first conducting side wall 32 such that a gap 37 is formed between the end 33 of second conducting side wall 34 and the open edge 39 of dielectric material 36. Decoupler 30 may optionally include one or more alignment features 40 that are complementary to alignment features 20 associated with printable label 10.

The thickness of conducting side walls 32 and 34, conducting end wall 38 and dielectric material 36 may be small. The thickness may be much less than the operating wavelength. For instance the total thickness of certain embodiments may be less than $\lambda/10$, or $\lambda/300$ or $\lambda/1000$. The thickness may be 1 mm or less, 2 mm or less, or 500 µm or less, or 100 µm or less. Embodiments of the present invention can therefore be thinner and lighter compared to foam spacers or known tuned antenna arrangements. Further, selection of appropriate materials and thicknesses can allow such a device to be flexible, enabling it to be applied to non-planar or curved surfaces.

Decoupler 30 is designed to decouple radiation at a particular frequency. It is convenient to consider a simplistic model of the functionality of the decoupler, in which RF waves are coupled into the cavity and propagate along inside it until they reach either a closed end e.g. metal wall, or an open end. A proportion of the wave is reflected at the end (whether the end is open or closed) and travels back along inside the cavity. In addition, the decoupler may be a convoluted structure, as shown in FIG. 5B, that is folded upon itself to create, in effect, a smaller footprint without sacrificing performance. Some examples of useful decouplers are shown in FIGS. 1B, 4, 5A-5B, 6A-6C, 7B and 9A-9C. Some useful decouplers are also described in U.S. patent application Ser. Nos. 11/474,082; 11/763.570; 12/519,657; and 12/519,109, the specifications each of which are incorporated herein by reference.

Referring again to FIG. 1A, printable label 10 should be of a size including a width, length and thickness sufficient to allow to be fed into a standard printer and/or an RFID capable label printer and/or label printer/programmer. Examples of useful RFID printers and/or tag programmers include, but are not limited to Zebra S4M, ZM400 RZ400 and R4PT; Sato GL408 and GL408e; and Printronix T4M and SL4M. Printable label 10 is preferably sized so that its dimensions are essentially the same as the planar surface dimensions of decoupler 30. That way, the decoupler surface is also protected by printable label 10. Generally, printable label will have a length ranging from about 3 mm to about 150 mm and a width ranging from about 3 mm to about 150 mm with more preferred dimensions ranging from a length of 3 mm to 30 mm and a width of from 3 mm to 15.24 mm.

The top surface of printable label 10 is a printable layer 12. The printable layer will typically include a layer of paper or printable polymeric material. Below the printable layer lies antenna 16 and programmable device 14. Antenna 16 and programmable device 14 are typically associated with the printable layer 12 using a layer 11 of adhesive or curable polymer material.

Printable layer 12 can be transparent or opaque. Moreover, the printable layer may be preprinted with some or all required printed subject matter. If the selected printable layer 12 is a polymer film, then useful polymer films may include, for example, be polyester films, polyvinyl chloride films, polyolefin films (poly-propylene, polyethylene), polycarbonate films, polystyrene films, polyamide films or cellulose acetate films. The printable layer or film will have a thickness of preferably from 8 microns to about 200 microns.

In one method for making printable label 10, adhesive or polymer material layer 11 is applied to the inside surface 13 of printable layer 12. Antenna 16 and programmable device 14 are attached to the adhesive material and the adhesive material is cured. Next adhesive layer 17 is applied to the cured layer 11 containing antenna 14 and programmable device 16 and optional backing layer 18 is applied to adhesive layer 17 to cover and protect it.

Antenna 16 will typically be made from an electrically conductive material and adhesively applied to the bottom of printable layer 12 or to one or both sides of an optional support or carrier film layer 15 which is preferably made of plastic. Antenna 16 will include antenna contacts which are associated with programmable device 14. Antenna 14 will typically have a thickness of from 1 to about 50 microns or more.

The programmable device 14 is likewise fastened to the bottom of printable layer 12 or to optional carrier film layer 15. Programmable device 14 will typically include first and second electrical contacts to facilitate an electrical connection between is programmable device 14 and antenna 16. An electrically conductive adhesive can be used to facilitate the electrical connection. Antenna 14 and programmable device 16 can be arranged on the same side of the optional carrier film layer 15. However the orientation of antenna 16 with respect to programmable device 14 can change depending upon many factors including the dimension requirements for printable label 10, the size of the components of printable label 10 and so forth.

In one embodiment of the invention the exposed surface 21 of the printable layer 12 may be a heat-sensitive recording layer. In this embodiment the printable layer will include dye precursor compound(s) which, when exposed to heat, reacts with a suitable partner compound to form a color. In another embodiment of the invention, the printable layer is designed as an ink-receiving recording layer for printing by means of the inkjet process.

On the surface opposite the printable layer is an adhesive layer 17 covered by optional backing layer 18. Adhesive layer 17 can be formed from commercially customary acrylic adhesives or customary laminating adhesives, especially if the cover layer is to be fastened permanently to the carrier film. In this embodiment of the invention the cover layer used is paper or card or a polymer film, in order to enable the printable RFID transponders to be used directly as identification cards, access authorization cards or tags. The basis weight of the paper/board for the cover layer is selected in accordance with the card rigidity required for the intended use.

In another embodiment of the invention, a self-sticking or pressure sensitive adhesive is used to form the adhesive layer 17. Examples of suitable pressure-sensitive adhesives for forming a pressure-sensitive adhesive layer are pressure-sensitively adhering aqueous dispersions based on acrylic acid, acrylate and copolymers thereof with vinyl acetate, acrylonitrile, diacetone acrylamide and/or crosslinked comonomers (e.g. divinylbenzene or ethylene dimethacrylate with and without modifying resin dispersions (hydrocarbon resins, alkylphenol resins, terpenephenol resins, betapinene resins, rosins, methylstyrene-vinyltoluene resins), acrylate pressure-sensitive adhesives in solution in organic solvents with, for example, rosin triglyceride resins or hydrogenated rosins as tackifier component, acrylates derivatized by copolymerization with bifunctional monomers, such as divinylbenzene or ethylene dimethacrylate, or by Copolymerisation with UV photoinitiators (e.g. benzophenone groups), radiation-crosslinkable pressure-sensitive hot-melt adhesives based on acrylate, pressure-sensitive hot-melt adhesives based on isobutyleneisoprene, isobutylene-butadiene or ethylene-butadiene or block copolymers comprising styrene (SIS-SB, SBS and SE/BS copolymers) with the addition of tackifier resins, e.g. aliphatic olefin resins, rosins or terpene-phenol resins or polyaromatic compounds, or petroleum-spirit-dissolved pressure-sensitive adhesives based on natural rubber, with coumaroneindene resins, rosins or hydrocarbon resins (e.g. polyterpenes or poly-beta-pinene) as tackifiers.

As noted above, adhesive layer 17 is optionally covered with backing layer 18 in order to protect the adhesive layer before it is applied to the decoupler. Backing layer 18 may be selected from any layer or sheet material that is designed to be detachable from an adhesive layer. Such backing layers will typically have at least one surface finished in such a way that on contact with the adhesive a connection is formed which, however, can be broken again without adversely affecting the adhesion of the adhesive layer.

Examples of suitable backing layers 18 include those having a surface layer including optional release agents such as polymers based on cellulose acetate, (meth)acrylates, acrylonitrile, vinyl chloride, vinyl ethers or copolymers thereof with, for example, maleic anhydride or modified with aldehyde resins or imine resins; waxes based on polyethyleneamides or polyamides and/or mixtures thereof with polymers based on nitrocellulose, polystyrene or vinyl chloride-vinyl acetate copolymers; polyvinyl esters with long-chain alcohols; chromium stearates and derivatives based thereon; and crosslinked polyorganosiloxanes, alone or in a mixture with vinyl ethers and/or maleic anhydride polymers.

The printable sheet, the interlayer and the adhesive layer can be applied to the carrier film by customary techniques known for this purpose. In the case of pressure-sensitive adhesive layers, and especially when these are to be applied from organic solvents, it is preferred to form a pressure-sensitive adhesive layer on the cover layer which has been provided with a release effect (adhesive property) and then to bring the polymer carrier film with the RFID transponders formed thereon into contact with the pressure-sensitive adhesive layer. In one embodiment of a continuous printable sheet, it is preferred to form at least one pre-prepared parting line as an intended separation point between the labels transversely to the running direction of the strip, in order to facilitate the separation of printed or unprinted labels from the strip. In an alternative embodiment for manufacturing printable label 10, antenna 16 and programmable device 14 are placed in a curable polymer material and the curable polymer is then cured to form a sheet precursor. Thereafter, a printable layer 12 is applied to one surface of the sheet precursor and an adhesive layer 17 and optional backing sheet 18 are applied to the opposite surface of the sheet precursor to form printable label 10.

It is preferred that a plurality of printable labels 10 are applied to a single backing layer 18 to form a sheet product that includes a plurality of printable labels 10. The sheet can take the form of a single sheet of paper, it can take the form of a strip of paper that is then rolled into or roll, and it can take on any other form that can be continuously or intermittently fed into a printer/tag programming device.

Figure 3:
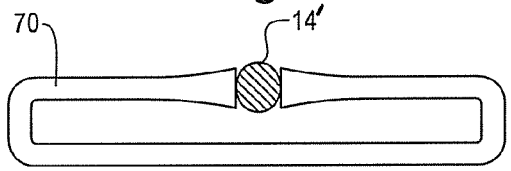
FIG. 3 is loop antenna embodiment.

The antenna 14 associated with printable label 10 may be any antenna known in the art to be useful with decoupled EM tags. The RFID tags assembled in the present invention may use an RF tag which only has a small antenna. As the decoupler couples radiation into its dielectric core and produces a high electric field at the open end of the cavity, a tag located in this region will be operating in an area of high field and will not require a large tuned antenna. Thus the decoupler of the present invention can be used with a so called low Q tag. FIG. 3 shows an example of a low Q tag, is which has a small loop 70 which connects to a programmable device 14' such as a chip. For example, the loop may be approximately 20 mm in length. The low Q tag will not function in free space unless the interrogating wavelength corresponds to the antenna's perimeter (e.g. 6 GHz operation for a 5 cm loop), and hence will not operate at standard UHF frequencies (e.g. 866 MHz) unless the reader is located within 1 or 2 mm of the chip, because the antenna 14' is inefficient at coupling to incident UHF radiation. The low Q tag, which may be only slightly larger than the chip itself, may be placed on any decoupler according to the invention. Note that the small loop section may be replaced by short 'arms' that extend outwards or partially wrap around a spacer, since even two short 'stubs' of metal are sufficient to help tune to the proper frequency and thereby couple power into the chip if combined with a correctly designed decoupler. Reduction in the antenna size allows for a more compact RF ID system without the need to wrap existing antennas around the body of the decoupler. A yet further advantage is reduced materials for the RF ID manufacture process.

The programmable device 14 may be any programmable device that can be associated with a decoupled EM or RFID tag in order to facilitate the functioning of the tag. It will be appreciated that a variety of programmable devices, such as RFID chips may be used in the present invention. Suitable RFID chips include Philips HSL chip, available from Philips Electronics, and the EM Marin EM4222, available from EM Microelectronic-Marin SA, as well as RFID chips available from Impnj (the Monza chip), Alien Technology (Higgs chip), NXP (the X-rag chip), Texas Instruments, Samsung and Hitachi.

Each printable label 10 may include one or more optional alignment features 20. Alignment feature 20 may be any feature(s) that allows printable label 10 to be properly aligned with decoupler 30 such that the resulting decoupled RFID tag is operable. Alignment features 20 and 40 may, for example, be a combination of grooves, alignment holes, alignment marks, recessed surfaces, raised edges and so forth that facilitate correct alignment of the two parts to form a decoupled EM tag. Optionally, a jig or other similar device may be used during the attachment process to speed assembly and insure correct placement.

In order to be maximally operable, the programmable device 16 in printable label 10 must be located at a portion of the decoupler top surface that is not covered by a conducting side wall 32 or 34. For example, the programmable device 14 of printable label 10 in FIG. 1A can be placed over gap 37 of decoupler 30 of FIG. 1B to form the decoupled EM tag shown in FIG. 1C. However the EM tags of this invention are still operable if programmable device 14 straddles end 33 of second conducting side wall 34 or even if the programmable device is placed at a minus location on the tuning plane.

Alignment feature 20 may or may not be complementary with alignment feature 40 of decoupler 30. Thus, alignment feature 20 may be one or more depressions or one or more raised tabs that are complementary to tabs or depressions on the surface of decoupler 30 to which printable label 10 is adhered. In another embodiment, shown in FIG. 6A, alignment feature 40 may be one or more tabs 45 complementary to indentations in printable label 10 In yet another alternative embodiment, alignment feature 20 may be a hole that passes completely through label 10 that is aligned with a complementary mark on decoupler 30. Just about any features known in the art to align two planar structures with one another can be used in the present invention.

The decoupled EM tags of this invention can be prepared using two parts by the following steps. A first step is to direct printable label 10 into a printer or some other device. One purpose of the printing step is to apply an optional unique identifier such as a one or two dimensional barcode, an inventory number, or some other identifier to the surface of printable label 10. The programmable device 14 associated with printable label 10 is also programmed during or immediately after the assembly process.

Next, the printed and optionally programmed printable label 10 is manipulated to expose adhesive layer 17. This manipulation can include removing the optional backing layer 18 from the label to expose the pre-applied adhesive layer 17 or it can include applying an adhesive material layer to the label bottom surface or decoupler top surface. Next, the adhesive layer 17 is placed against decoupler top surface 43 in order to form a decoupled EM tag such as that shown in FIG. 1C.

The assembly process can be a fully manual process, optionally facilitated by placement of alignment marks on the separate components; partially automated by the use of a jig or similar device to insure that the pieces are assembled to tolerance; or fully automated, either as part of the printing and encoding process, or as a separate device, the result of which combines the two pieces to form a functional decoupled EM tag.

Figure 2:
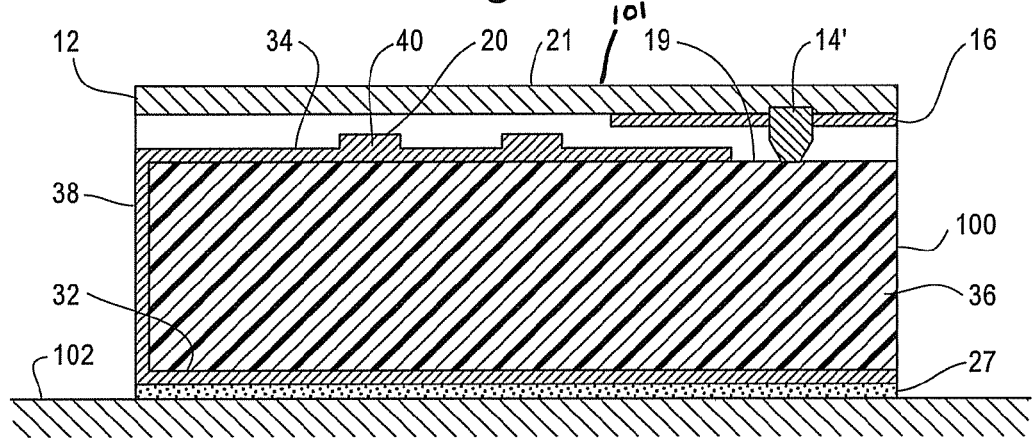
FIG. 2 is an assembled decoupled EM tag embodiment of this invention prepared by combining the FIG. 1A and FIG. 1B pieces.

An embodiment of a decoupled EM tag 100 of this invention is shown in FIG. 2 where decoupled EM tag is associated with the surface 102 of an item. Generally, decoupler 30 or decoupled EM tag 100 will be attached to an item via adhesive layer 27 associated with the first conductive side wall 32. EM tag 100 includes a printed top surface 101. Moreover, EM tag 100 includes an antenna 16 and programmed device 14' where the programmed device 14' lies at least partially to totally over a portion of the decoupler top surface 19 that is not covered with the conducting side wall 34 material. Other decoupled EM tag embodiments that fall within the scope of this invention are discussed below.

The EM tags of this invention are generally associated with an item. The "item" refers to any tangible creation or construction which is known now to be usefully tagged with an EM tag and any future item that becomes know to be usefully tagged with an EM tag. Some limited examples of items include consumer items such as computers, televisions, cameras, appliances, automobiles and the like, industrial items such as parts, machines, tools and the like, items that are moving such as robots, trucks, automobiles, and packages, boxes, crates etc. . . . that are used to store and/or ship items.

While the numbers of items that EM tags can be applied to is near infinite, it is is preferred that the decoupled EM tags of this invention are applied to items having metal surfaces or that hold liquids as such items are able to be effectively EM tagged with coupled EM tags.

Figure 4:
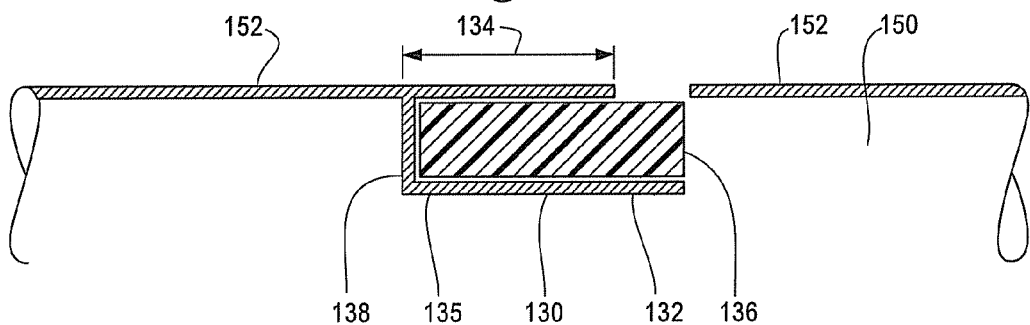
FIG. 4 is a cross section of an item housing including an integral decoupler.

In another embodiment shown in FIG. 4, a decoupler 130 can be pre-manufactured into an item. For example, a decoupler can be formed into a computer case or into a telephone switch. FIG. 4 is a cross section of a case or housing 150 for an item. Housing 150 includes an outside metal skin 152 that forms second conducting side wall portion 134 of decoupler 130. Also integral to metal surface layer 152 is conductive base portion 138 which electrically unites essentially parallel first and second conducting side walls 132 and 134. The combination of conducting side walls 132 and 134 and base portion 138 defines a sub-wavelength cavity 135 that encloses a dielectric material 136 which may be air or may be one or more dielectric materials. When a decoupler is pre-manufactured into an item, the end user has a choice of whether or not to attach a printed and programmed printable sheet 10 to the housing to form an EM tag. Incorporating the decoupler into the item also eliminates the need for the end user to purchase a separate decoupler to form a decoupled EM tag.

Figure 5A:
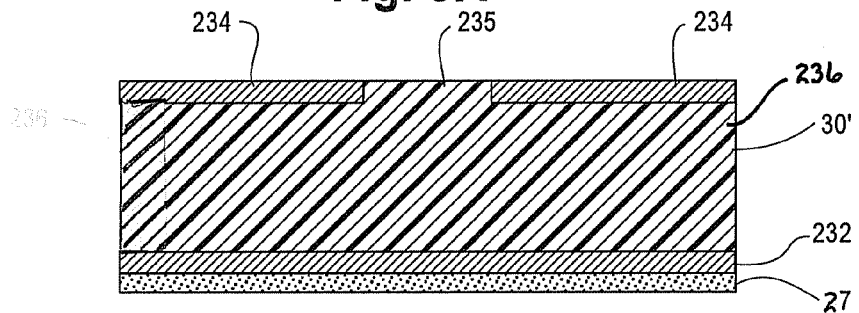
FIGS. 5A and 5B are side views of several more decoupler embodiments useful in the present invention.
Figure 5B:
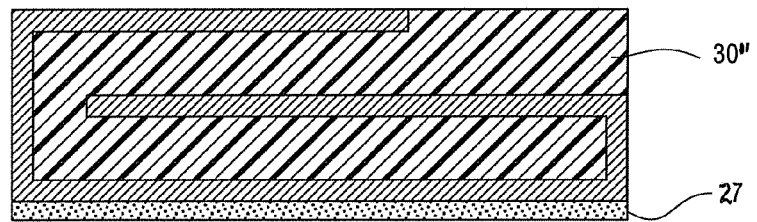
Figure 6A:
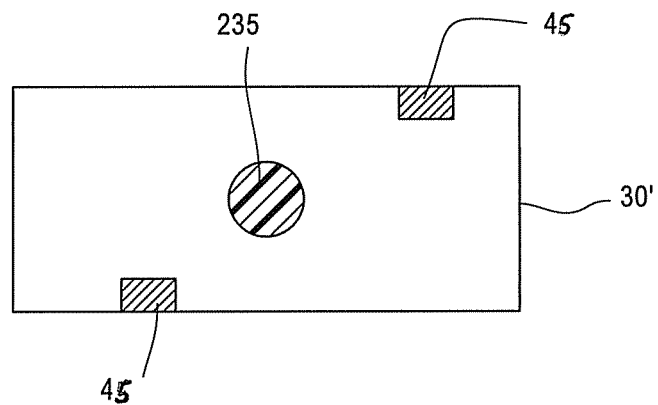
FIGS. 6A-6C are overhead views of decoupler embodiments of this invention showing the location of gap 235.
Figure 6B:
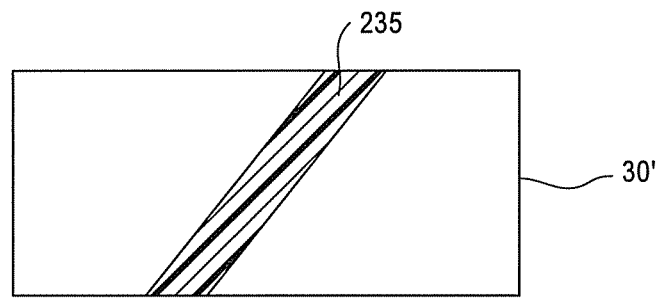
Figure 6C:
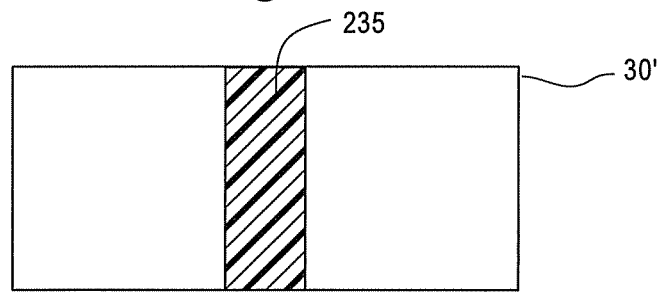

While the present invention is useful for manufacturing any type of decoupled EM tag from two separate parts, preferred decoupled EM tags have several final decoupler configurations. The first decoupler configuration is shown in FIG. 1B and described above. An alternative decoupler configuration 30' is shown in FIG. 5A. This alternative decoupler structure includes a first conducting side wall 232 and a second conducting side wall 234 oriented essentially parallel to one another and spaced apart from one another by dielectric material layer 236. In this embodiment, first conducting side wall 232 and second conducting side wall 234 are not electrically connected. In preferred decoupler embodiments, the conductive material layer on the decoupler top surface should include a gap 235 that exposes the underlying dielectric material. In the embodiment shown in FIG. 1C, the gap 19 is located at an edge of the decoupler and is formed as a result of the decoupler first side wall and second side wall having unequal lengths. In the decoupler embodiment shown in FIG. 5A, gap 235 may be formed by placing a hole, a space or so forth in the second conducting side wall 234 and as shown from above in FIGS. 6A-6C.

Figure 7A:
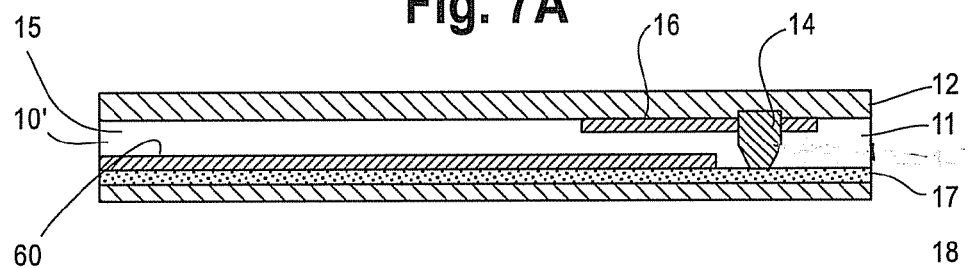
FIGS. 7A, 7B and 7C show embodiments of a printable layer decoupler and decoupled EM tag respectively.
Figure 7B:
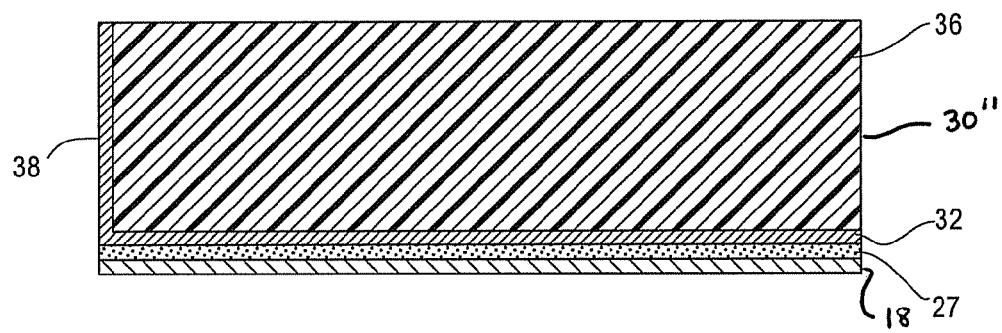
Figure 7C:
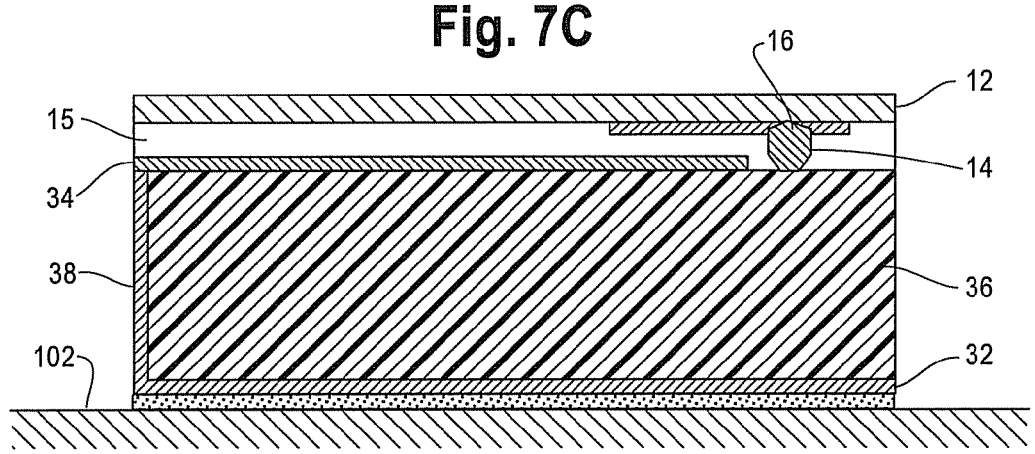

In an alternative embodiment of this invention, the decoupler second conducting side wall 34 can be associated with printable sheet 10 and thereafter applied to a decoupler embodiment to form a decoupled EM tag. FIGS. 7A, 7B and 7C show a printable layer embodiment, decoupler and decoupled EM tag respectively made in accordance with this alternative embodiment. FIG. 7A is a printable sheet 10' having a printable layer 12, a programmable device 14, an antenna 16, and an adhesive layer 17. Interposed between the adhesive layer 17 and the antenna 16 and programmable device 14 is a conducting side wall layer 60. The printable label 10' shown in FIG. 7A is applied to decoupler 30" of FIG. 7B. Decoupler 30" includes a first conducting side wall 32, a conducting end wall 38 and a dielectric layer 36. When label 10' is adhesively associated with decoupler 30", the result is the decoupled EM tag shown in FIG. 7C having a decoupler that now includes a second conducting side wall 34.

Incorporating second conducting sidewall 60 into printable label 10' can lead to several advantages one of which is that it provides the end user with more flexibility in dictating the type of decoupled EM tag that is made from EM tag parts. This is seen more readily in FIGS. 8, 9A-9C and 10A-10C. FIG. 8 is a printable label embodiment 200 that can be used in conjunction with two or more decoupler configurations to form two or more decoupled EM tag configurations. Printable label 200 includes a printable layer 12, a programmable device 14, an antenna 16, and an adhesive layer 17. Interposed between the adhesive layer 17 and the antenna 16 and programmable device 14 is a conducting side wall layer 60. In addition, printable label 200 may or may not include an indentation(s) 205 that runs along the length of the label to assist in applying a fold to the label.

FIGS. 9A, 9B and 9C are decoupler embodiments 300, 301 and 302. Decoupler embodiments 300 and 301 both include a first conducting side wall 32 and a dielectric layer 36. One difference between decoupler 300 and decouplers 301 and 302 is that decoupler 300 has a length that is essentially equal to the length of printable label 200 while printable label 200 is longer than decouplers 301 and 302.

FIGS. 10A, 10B and 10C show decoupled RF tags 310, 311 and 312 formed by applying printable label 200 to the top surface of each of decouplers 300, 301 and 301. In particular, the decoupled EM tag of FIG. 9A is essentially identical to the decoupled EM tag shown in FIG. 5 that has no conducting end wall. Decoupled EM tags 311 and 312 are more like the decoupled EM tag shown in FIG. 2 except that printable label 200 is folded at one edge of decoupler 301 to form a cavity defined by first and second conductive side walls 32 and 34 and end wall 36. Decoupled EM tag 312 includes no integral first conductive side wall. Instead, the decoupler 302 is associated with a metal surface 315 which effectively becomes the first conductive side wall. Printable label 200 is then folded at one edge of decoupler 302 to form, in combination with metal surface 315, a cavity defined by metal surface 315, second conductive side walls 34 and end wall 36. In this manner, the same printable label can be combined with decouplers having different configurations to form a variety of decoupled EM tags.

Still another embodiment of this invention is shown in FIGS. 11A-11C. In particular FIG. 11A is a deconstructed, very thin sheet useful for fabricating a decoupler portion of an EM tag. The deconstructed decoupler includes at least a partial adhesive layer 275 overlayed by a conductive material layer 276 which in turn is overlayed by a dielectric material layer 277. On top of the dielectric material layer 277 is a second thin adhesive layer 278. The conductive material layer 276 shown in FIG. 11A does not extend to the edge of the sheet. However, in certain embodiments, the conductive material layer can extend to the edge of the sheet depending upon the type of decoupler that will be constructed from the sheet.

The sheet includes folding sites 279 and 279'. The decoupler shown in FIG. 11B is fabricated by upwardly folding the sheet at fold 279' until the adhesive material layer 278 associated with the folded portion 280 contacts the stationary dielectric surface 283 such that the conductive material layer portion of the folded portion is essentially parallel to the conductive material layer portion of the stationary portion. Next, the sheet shown in FIG. 11A is folded upwardly at fold 279 until the adhesive material layer 278 associated with folded portion 281 abuts the now upwardly facing surface 282 of the conductive material layer portion associated with folded portion 280. Again, the conductive material layer portion associated with folded portion 281 will be essentially parallel to the conductive material layer portion associated with folded portion 280. The resulting decoupler is shown in FIG. 11B.

FIG. 11C shows the deconstructed decoupler of FIG. 11A further including an integral printable sheet 10. The printable sheet 10 includes a printable surface, a programmable device 14 and an antenna 16. The combination forms a deconstructed printable and programmable EM tag that, after printing, programming and folding as described above forms a decoupled EM tag as shown essentially in FIG. 10B.

The embodiments of this invention all use or include printable labels. The printable labels are printed and programmed as discussed above by loading a sheet including one or more printable labels 10 as a single or continuous stream of labels preferably either in a roll or fanfoled into a printer and programmer. The user then inputs program settings into the printer/programmer to set such variables as the number of labels to be printed, what is to be printed on the labels and so forth. The printer then forms an image on the surface of the printable layer of printable label 10 and the programmable device is automatically programmed as it enters and/or exits the printing/programming device.

The printable labels 10 and decouplers 30 can be provided separately or they may be sold in kits. As noted above, the decoupler can be manufactured into the item being tagged. Alternatively, kits including the same type or a variety decoupler sizes and types can be supplied to the end user along with corresponding multiple label sizes. The user can, on-demand, select an appropriate decoupler size and then select the appropriate label for the decoupler before printing, programming and applying the label is to the decoupler to form a decoupled EM tag.

What is claimed is:

1. A deconstructed decoupler comprising:
a sheet including a conductive material layer and a dielectric layer, the conductive material layer having a first surface and a second surface, wherein the dielectric layer is associated with the conductive material layer second surface and at least one folding point wherein the folding point allows the sheet to be folded over upon itself at least one time such that the conductive material layer is prevented from creating a short circuit.

2. The deconstructed decoupler of claim 1 wherein there is a gap between an edge of the conductive material layer and the edge of the sheet.

3. The deconstructed decoupler of claim 2 including a programmable device and an antenna located essentially in the gap between the edge of the conductive material layer and the edge of the sheet.

4. The deconstructed decoupler of claim 1 wherein dielectric layer has a first surface that abuts the conductive material layer and a second surface including an adhesive material layer.

5. The deconstructed decoupler of claim 3 including a printable sheet associated with at least a portion of the conductive material layer first surface.

6. The deconstructed decoupler of claim 5 wherein printable sheet covers the antenna and the programmable device.

7. The deconstructed decoupler of claim 6 wherein the programmable device is an RFID chip.

8. The deconstructed decoupler of claim 6 including at least one foldable portion and at least one stationary portion.

9. A method for forming a decoupled EM tag from the deconstructed decoupler of claim 6 by the steps of:
programming the programmable device; and
folding the at least one foldable portion until a top surface of the foldable portion abuts a top surface of the stationary portion to form a once folded decoupled EM tag.

10. The method of claim 9 wherein the deconstructed includes a second foldable portion and wherein the second foldable portion is folded until a top surface of the second foldable portion contact a top surface of the once folded decoupled EM tag to form a twice folded decoupled EM tag.

* * * * *